United States Patent
Lillestolen et al.

(10) Patent No.: US 10,502,590 B2
(45) Date of Patent: Dec. 10, 2019

(54) POSITION DETECTION SYSTEMS AND METHODS

(71) Applicant: Hamilton Sundstrand Corporation, Charlotte, NC (US)

(72) Inventors: Kirk A. Lillestolen, East Hartford, CT (US); Gary L. Hess, Enfield, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/114,478

(22) Filed: Aug. 28, 2018

(65) Prior Publication Data

US 2018/0364070 A1    Dec. 20, 2018

Related U.S. Application Data

(63) Continuation of application No. 15/487,819, filed on Apr. 14, 2017, now Pat. No. 10,222,239.

(51) Int. Cl.
    *G01D 5/20*        (2006.01)
    *F16K 37/00*      (2006.01)
                (Continued)

(52) U.S. Cl.
    CPC ............ *G01D 5/20* (2013.01); *F16K 31/0679* (2013.01); *F16K 37/0041* (2013.01);
                (Continued)

(58) Field of Classification Search
    CPC ......... B60R 1/00; B60R 2225/00; B60T 1/00; B60T 7/00; G01N 1/00; G01N 2201/00;
                (Continued)

(56) References Cited

U.S. PATENT DOCUMENTS 4,159,444 A    6/1979    Bartlett et al.
5,548,164 A    8/1996    Hillard et al.
              (Continued)

FOREIGN PATENT DOCUMENTS

EP         0190467 A2    8/1986

OTHER PUBLICATIONS

Extended European Search Report dated Sep. 11, 2018, issued during the prosecution of European Patent Application No. EP 18167448.2 (5 pages).

*Primary Examiner* — Jermele M Hollington
*Assistant Examiner* — Temilade S Rhodes-Vivour
(74) *Attorney, Agent, or Firm* — Locke Lord LLP; Alicia J. Carroll; Georgi Korobanov

(57) ABSTRACT

A system for detecting a position of a dual solenoid device includes device configured to move between first and second positions, and a controller. The controller has first and second monitoring circuits in operable communication with first and second channels, respectively. The first and second channels are in operable communication with first and second solenoids, respectively. Each solenoid is configured to selectively operate as an active solenoid to move the device when the solenoid and its respective channel are in an active mode, and as a passive solenoid when the solenoid and its respective channel are in a passive mode to passively move with the active solenoid. Each of the monitoring circuits is configured to determine a position of the device when the channel the monitoring circuit is associated with is operating in the passive mode by monitoring an electrical parameter of the passive solenoid associated with that channel.

15 Claims, 1 Drawing Sheet

(51) Int. Cl.
*F16K 31/06* (2006.01)
*H01F 7/18* (2006.01)
*F16K 1/00* (2006.01)
*H01H 1/00* (2006.01)

(52) U.S. Cl.
CPC ......... *G01D 5/2013* (2013.01); *H01F 7/1844* (2013.01); *F16K 1/00* (2013.01); *H01H 1/00* (2013.01); *H01L 2221/00* (2013.01)

(58) Field of Classification Search
CPC . G01R 1/00; H01H 1/00; H01H 45/00; H01H 63/00; H01H 69/00; H01H 2201/00; H02H 1/00
See application file for complete search history.

(56) References Cited

U.S. PATENT DOCUMENTS

| | | | |
|---|---|---|---|
| 6,168,001 B1 | 1/2001 | Davis | |
| 6,269,784 B1 | 8/2001 | Newton | |
| 6,422,816 B1 * | 7/2002 | Danielson | B64C 11/301 415/36 |
| 6,513,885 B1 * | 2/2003 | Salamat | B60T 8/1703 303/122.09 |
| 6,661,219 B2 | 12/2003 | Schmidt | |
| 7,246,489 B2 | 7/2007 | Du Plessis et al. | |
| 7,487,973 B1 * | 2/2009 | Kesselgruber | B60G 17/0162 280/124.157 |
| 7,768,257 B2 | 8/2010 | Lueck | |
| 8,710,828 B1 | 4/2014 | Meisel | |
| 9,300,192 B2 | 3/2016 | Weinl et al. | |
| 9,483,032 B2 * | 11/2016 | Kamenetz | F02D 41/22 |
| 2001/0043450 A1 | 11/2001 | Seale et al. | |
| 2006/0124360 A1 | 6/2006 | Lee et al. | |
| 2007/0178529 A1 | 8/2007 | Breidford et al. | |
| 2008/0227663 A1 * | 9/2008 | Tisone | B01J 19/0046 506/39 |
| 2013/0014499 A1 | 1/2013 | Gray, Jr. | |
| 2013/0020516 A1 * | 1/2013 | Kish | F16K 31/0634 251/129.17 |
| 2015/0300843 A1 | 10/2015 | Hunter et al. | |
| 2016/0258736 A1 | 9/2016 | Bachar et al. | |

* cited by examiner

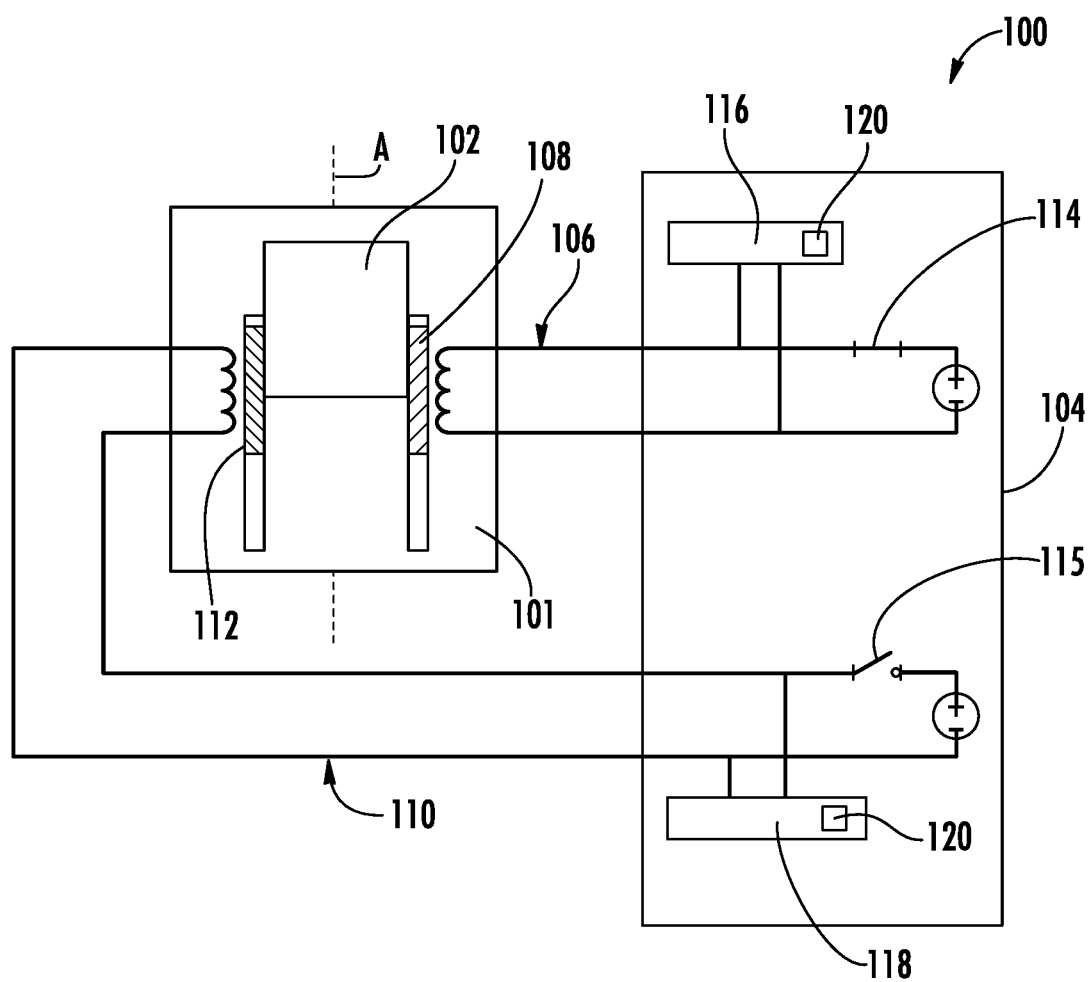

POSITION DETECTION SYSTEMS AND METHODS

CROSS-REFERENCE TO RELATED APPLICATIONS

This application is continuation application of U.S. patent application Ser. No. 15/487,819, filed Apr. 14, 2017, the contents of which are incorporated by reference herein in their entirety.

BACKGROUND OF THE INVENTION

1. Field of the Invention

The subject disclosure relates to solenoid valves or actuators, in particular systems and methods for detecting the position of a dual solenoid valve or actuator.

2. Description of Related Art

Many aerospace applications utilize solenoids for actuators or valves. Independent measurements of actuator/valve position are sometimes taken. Traditionally, this measurement is taken with a dedicated sensor or switch that indicates the position of the valve/actuator. This extra sensor or switch tends to add additional system cost and weight and also tends to add additional electrical harnessing in the aircraft. Additionally, for many flight critical systems, the solenoid actuator or valve may be dual channel for additional redundancy. Often, only one channel (the active channel) will control the solenoid actuator/valve, while the second channel (the passive channel) will be in an in-active mode ready to engage the solenoid if required.

Such conventional methods and systems have generally been considered satisfactory for their intended purpose. However, there is still a need in the art for systems and methods that allow for improved measurement of actuator/valve position. The present invention provides a solution for this need.

SUMMARY OF THE DISCLOSURE

The subject invention is directed to a new and useful system for detecting the position of the dual solenoid device. The system includes a device configured to move between at least a first position and a second position, and a controller. The controller has a first monitoring circuit in operable communication with a first channel. The first channel is in operable communication with a first solenoid. The controller includes a second monitoring circuit in operable communication with a second channel. The second channel is in operable communication with a second solenoid. Each solenoid is configured to selectively operate as an active solenoid to move the device when the solenoid and the channel it is in operable communication with are in an active mode. Each solenoid is configured to selectively operate as a passive solenoid when the solenoid and the channel it is in operable communication with are in a passive mode to passively move with the active solenoid. Each of the monitoring circuits is configured to determine a position of the device when the channel the monitoring circuit is associated with is operating in the passive mode by monitoring an electrical parameter of the passive solenoid associated with that channel.

Each channel can have a discrete switch associated with the controller for activating the channel. The first and second solenoids can be mechanically coupled to the device. It is contemplated that the device can be a valve and/or actuator.

In one embodiment of the subject invention, movement of the device from the first position to the second position is detected by monitoring the presence of an induced voltage across the passive solenoid when the device is moving. The presence of the induced voltage across the passive solenoid can be measured by a high speed analog/digital convertor.

In another embodiment of the subject invention, movement of the valve or actuator from the first position to the second position is detected by monitoring a change in inductance in the passive solenoid. The change in inductance in the passive solenoid can be measured by applying an AC waveform to the channel in operable communication with the passive solenoid at a frequency and current level that will not engage the passive solenoid. The frequency level of the AC waveform applied to the channel in operable communication with the passive solenoid can be in the range of about 3 to about 10 kH.

In accordance with another aspect, a method of determining the position of a dual solenoid device includes designating one of a first channel and a second channel as an active channel and the other channel as a passive channel. Both channels are in operable communication with a respective solenoid. Each solenoid is in operable communication with a device and configured to move the device in response to being the active channel and to monitor a position of the device in response to being the passive channel. The method includes determining the position of the device by monitoring an electrical parameter of the solenoid in operable communication with the passive channel.

In accordance with one embodiment, the solenoid in operable communication with the passive channel is a passive solenoid and monitoring the electrical parameter of the passive solenoid includes monitoring the presence of an induced voltage across the passive solenoid. The method can include measuring the presence of an induced voltage across the passive solenoid with a high speed analog/digital convertor.

In accordance with another embodiment, the solenoid in operable communication with the passive channel is a passive solenoid. Monitoring the electrical parameter of the passive solenoid comprises monitoring a change in inductance in the passive solenoid. Monitoring the change in inductance in the passive solenoid comprises applying an AC waveform to an associated channel at a frequency and current level that will not engage the passive solenoid.

In accordance with some embodiments, the device is device is at least one of a valve or actuator. It is contemplated that the first and second solenoids can be mechanically coupled to the device, however, those skilled in the art will readily appreciate that mechanical coupling is not required.

These and other features of the subject invention and the manner in which it is manufactured, assembled and employed will become more readily apparent to those having ordinary skill in the art from the following enabling detailed description of the preferred embodiments of the subject invention taken in conjunction with the several drawings described below.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein:

FIG. 1 is a schematic representation of the position detection system of the subject invention wherein one of the channels is active such that the solenoid associated with the active channel is actively engaged with the valve or actuator and the other channel is operating in a passive mode such that the solenoid associated with the passive channel passively moves with the valve or actuator.

DETAILED DESCRIPTION OF THE PREFERRED EMBODIMENTS

Referring now to the drawings wherein like reference numerals identify similar structural elements or features of the prior art and the subject invention. For purposes of explanation and illustration, and not limitation, a schematic depiction of an exemplary embodiment of a position detection system constructed in accordance with the disclosure is shown in FIG. 1 and is designated generally by reference character 100.

As shown in FIG. 1, there is illustrated the subject system 100 for detecting the position of a device, such as a solenoid valve or actuator 102, in aerospace applications and the like. Embodiments of the current invention will eliminate the need for the independent discrete switches or sensors to determine solenoid position by utilizing the relationship between the two solenoids in an active/passive configuration. System 100 includes a device, for example, a valve or actuator 102, mounted in a housing 101 for movement between a first position and a second position. Those skilled in the art will readily appreciate that the first and second positions can be positions along longitudinal axis A. System 100 also has a controller 104, a first channel 106 having a first solenoid 108 coupled to the valve or actuator 102, and a second channel 110 having a second solenoid 112 coupled to valve or actuator 102. First and second solenoids 108 and 112, respectively, are mechanically coupled to valve or actuator 102. Those skilled in the art will readily appreciate that a mechanical coupling is not required.

With continued reference to FIG. 1, each channel 106 and 110 of system 100 selectively operates as an active channel in which solenoid 108 or 112 associated therewith actively moves valve or actuator 102 between the first position and the second position, or as a passive channel in which solenoid 108 or 112 associated therewith passively moves with the valve or actuator 102 between the first position and the second position. Solenoid 108 or 112 associated with the active channel operates as an active solenoid to move valve or actuator 102 in an active mode. Solenoid 108 or 112 associated with the passive channel operates as a passive solenoid to passively move with the active solenoid. Each of channels 106 and 108 has a discrete switch 114 and 115, respectively, associated with controller 104 for activating its respective channel 106 and 110. Controller 104 includes monitoring circuits 116 and 118 associated with respective channels 106 and 110 for verifying the position of the valve or actuator 102 when their respective channel is operating as a passive channel, by monitoring an electrical parameter of solenoid 108 or 112 associated with that channel. In FIG. 1, channel 106 is in active mode and is engaged as the active channel and channel 110 is in passive mode, e.g. channel 110 is the passive channel. In the active/passive configuration, active channel 106 engages its respective solenoid 108, e.g. the active solenoid, and solenoid 112, e.g. the passive solenoid, of passive channel 110 also moves. Two different electrical parameters of solenoid 112 of channel 110 are then used to verify that the active channel's solenoid 108 has moved the valve/actuator 102.

As shown in FIG. 1, in one embodiment of the subject invention, movement of the valve or actuator 102 from the first position to the second position is detected by monitoring the presence of an induced voltage across passive solenoid 112 associated with passive channel 110 when valve or actuator 102 is moving by using corresponding monitoring circuit 118. It is contemplated that the presence of an induced voltage across passive solenoid 112 associated with the passive channel 110 can be measured by a high speed analog/digital convertor 120. Those skilled in the art will readily appreciate that for dynamic movement checks one can record the voltage across the passive channels solenoid to check for the presence of an induced voltage while the actuator/valve is moving. Those skilled in the art will also readily appreciate that channel 106 can be the passive channel while channel 110 is active and solenoid 108 associated with passive channel 106 can be the passive solenoid 108 passively moved with the valve or actuator 102 between the first position and the second position.

With continued reference to FIG. 1, in another embodiment of the subject invention, movement of the valve or actuator 102 from the first position to the second position is detected by monitoring a change in inductance in passive solenoid 112 associated with passive channel 110. Knowing that the solenoid inductance may change as a function of the position of valve or actuator 102, one can measure the inductance of passive solenoid 112 to determine the position of valve or actuator 102. Preferably, the change in inductance in passive solenoid 112 associated with the passive channel 110 is measured by applying an AC waveform to passive channel 110 at a frequency and current level that will not engage solenoid 112 associated with the passive channel 110. The frequency level of the AC waveform applied to passive channel 110 is preferably in the range of about 3 to about 10 kH. The current would typically range from about 100 uA to about 50 mA. Those skilled in the art will readily appreciate that this would be sized so as to be at least twice the drop out current. Those skilled in the art will readily appreciate that embodiments of the subject invention can provide discrete position measurements, continuously detect position measurements, or a combination of both. The AC waveform can be supplied to channels 110 and/or 112 by a digital-to-analog converter (DAC), field-programmable gate array (FPGA), oscillator through filter, and the like. It is contemplated that the device supplying the waveform would be included in monitor circuits 116 and 118.

The methods and systems of the present disclosure, as described above and shown in the drawings, provide position detection systems with superior properties, including reduced weight and reduced harness complexity. While the subject disclosure has been shown and described with reference to preferred embodiments, those skilled in the art will readily appreciate that changes and/or modifications may be made thereto without departing from the scope of the subject disclosure.

What is claimed is:

1. A system for detecting a position of a dual solenoid device, comprising:
   a device configured to move between at least a first position and a second position; and
   a controller having a first monitoring circuit in operable communication with a first channel, wherein the first channel is in operable communication with a first solenoid, and wherein the controller includes a second monitoring circuit in operable communication with a second channel, wherein the second channel is in operable communication with a second solenoid, wherein each solenoid is configured to selectively operate as an active solenoid to move the device when the solenoid and the channel it is in operable communication with are in an active mode, wherein each solenoid is configured to selectively operate as a passive solenoid when the solenoid and the channel it is in operable communication with are in a passive mode to passively move with the active solenoid, each of the monitoring circuits being configured to determine a position of the device when the channel the monitoring circuit is associated with is operating in the passive mode by monitoring an electrical parameter of the passive solenoid associated with that channel.

2. A system as recited in claim 1, wherein movement of the device from the first position to the second position is detected by monitoring the presence of an induced voltage across the passive solenoid when the device is moving.

3. A system as recited in claim 2, wherein the presence of the induced voltage across the passive solenoid is measured by a high speed analog/digital convertor.

4. A system as recited in claim 1, wherein movement of the device from the first position to the second position is detected by monitoring a change in inductance in the passive solenoid.

5. A system as recited in claim 4, wherein the change in inductance in the passive solenoid is measured by applying an AC waveform to the channel in operable communication with the passive solenoid at a frequency and current level that will not engage the passive solenoid.

6. A system as recited in claim 5, wherein the frequency level of the AC waveform applied to the channel in operable communication with the passive solenoid ranges from 3 to 10 kH.

7. A system as recited in claim 1, wherein the first and second solenoids are mechanically coupled to the device.

8. A system as recited in claim 1, wherein each channel has a discrete switch associated with the controller for activating the channel.

9. A system as recited in claim 1, wherein the device is at least one of a valve or actuator.

10. A method of determining a position of a dual solenoid device comprising:
designating one of a first channel and a second channel as an active channel and the other channel as a passive channel, both channels being in operable communication with a respective solenoid, wherein each solenoid is in operable communication with a device and configured to move the device in response to being the active channel and to monitor a position of the device in response to being the passive channel; and
determining the position of the device by monitoring an electrical parameter of the solenoid in operable communication with the passive channel.

11. A method as recited in claim 10, wherein the solenoid in operable communication with the passive channel is a passive solenoid, wherein monitoring the electrical parameter of the passive solenoid comprises monitoring the presence of an induced voltage across the passive solenoid.

12. A method as recited in claim 11, further comprising measuring the presence of an induced voltage across the passive solenoid with a high speed analog/digital convertor.

13. A method as recited in claim 10, wherein the solenoid in operable communication with the passive channel is a passive solenoid, wherein monitoring the electrical parameter of the passive solenoid comprises monitoring a change in inductance in the passive solenoid.

14. A method as recited in claim 13, wherein monitoring the change in inductance in the passive solenoid comprises applying an AC waveform to an associated channel at a frequency and current level that will not engage the passive solenoid.

15. A method as recited in claim 10, wherein the device is at least one of a valve or actuator.

* * * * *